(12) United States Patent
Andreev et al.

(10) Patent No.: US 7,877,724 B2
(45) Date of Patent: Jan. 25, 2011

(54) DECISION TREE REPRESENTATION OF A FUNCTION

(75) Inventors: Alexander Andreev, San Jose, CA (US);
Vojislav Vokovic, Santa Clara, CA (US);
Ranko Scepanovic, Saratogo, CA (US)

(73) Assignee: LSI Corporation, Milpitas, CA (US)

( * ) Notice: Subject to any disclaimer, the term of this patent is extended or adjusted under 35 U.S.C. 154(b) by 224 days.

(21) Appl. No.: 12/117,851

(22) Filed: May 9, 2008

(65) Prior Publication Data

US 2009/0281969 A1 Nov. 12, 2009

(51) Int. Cl.
*G06F 17/50* (2006.01)
(52) U.S. Cl. ................................... 716/100
(58) Field of Classification Search .............. 716/1, 716/12, 100
See application file for complete search history.

(56) References Cited

U.S. PATENT DOCUMENTS

| 5,146,583 | A | * | 9/1992 | Matsunaka et al. | 716/3 |
| 5,801,957 | A | * | 9/1998 | Lehman et al. | 716/18 |
| 2007/0250522 | A1 | * | 10/2007 | Perrizo | 707/101 |
| 2009/0281981 | A1 | * | 11/2009 | Chen et al. | 706/56 |
| 2009/0307638 | A1 | * | 12/2009 | McConaghy | 716/4 |

* cited by examiner

*Primary Examiner*—Jack Chiang
*Assistant Examiner*—Suchin Parihar
(74) *Attorney, Agent, or Firm*—Otterstedt, Ellenbogen & Kammer, LLP

(57) ABSTRACT

An arbitrary function may be represented as an optimized decision tree. The decision tree may be calculated, pruned, and factored to create a highly optimized set of equations, much of which may be represented by simple circuits and little, if any, complex processing. A circuit design system may automate the decision tree generation, optimization, and circuit generation for an arbitrary function. The circuits may be used for processing digital signals, such as soft decoding and other processes, among other uses.

15 Claims, 5 Drawing Sheets

100
SYSTEM FOR GENERATING A
CIRCUIT REPRESENTATION
OF A FUNCTION

DECISION TREE REPRESENTATION OF A FUNCTION

BACKGROUND

Complex functions are often difficult to implement in hardware. A hardware implementation may be a dedicated circuit that takes an input and returns an output corresponding to the function. When functions are quite complex, performing the actual calculations of the function can consume a large amount of circuitry and this area of an integrated circuit.

Some complex functions may be represented using lookup tables or piecewise linear approximations. Such representations may have accuracy or performance problems.

SUMMARY

An arbitrary function may be represented as an optimized decision tree. The decision tree may be calculated, pruned, and factored to create a highly optimized set of equations, much of which may be represented by simple circuits and little, if any, complex processing. A circuit design system may automate the decision tree generation, optimization, and circuit generation for an arbitrary function. The circuits may be used for processing digital signals, such as soft decoding and other processes, among other uses.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS in the drawings.

DETAILED DESCRIPTION

Figure 1:
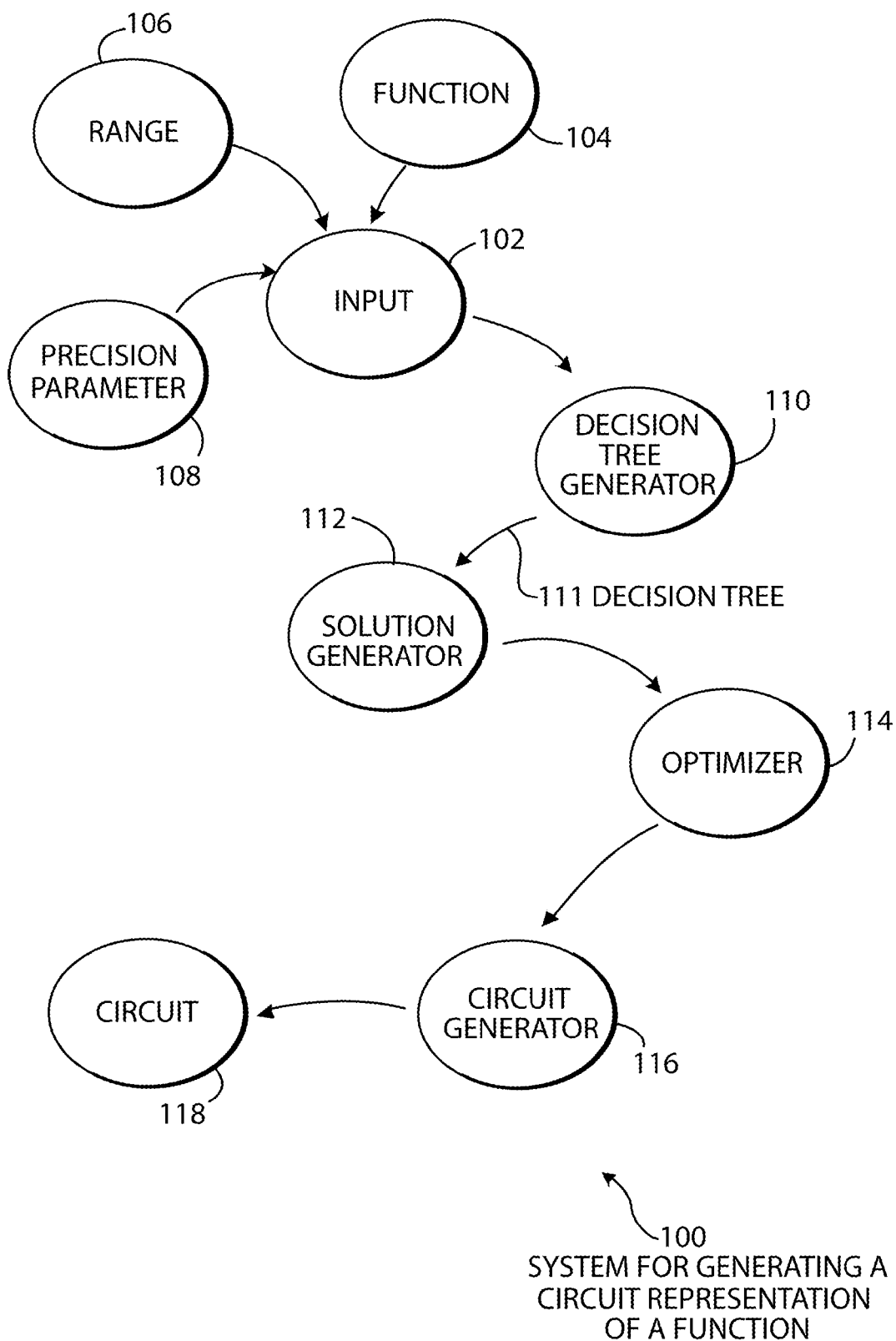
FIG. 1 is a diagram illustration of an embodiment showing a system for generating a circuit representation of a function.

An arbitrary function may be represented in a hardware circuit using a decision tree. The decision tree may be generated based on the range and precision of the input variable and may be populated according to the desired precision of the output. The decision tree may be used to generate circuits that generate an output according to the function without having to perform complex functions. In many cases, the decision tree circuit may be significantly less complex and much faster than a circuit where large amounts of computations are performed.

One example of a use of such a circuit may be in a soft decoding function. Specifically, a Gallager function may be performed as part of a soft decode process such as a low density parity check (LDPC) code. The Gallager function is $$f(x) = \ln\frac{e^x + 1}{e^x - 1}$$

and may be cumbersome to implement in an integrated circuit.

Throughout this specification, like reference numbers signify the same elements throughout the description of the figures.

When elements are referred to as being "connected" or "coupled," the elements can be directly connected or coupled together or one or more intervening elements may also be present. In contrast, when elements are referred to as being "directly connected" or "directly coupled," there are no intervening elements present.

The subject matter may be embodied as devices, systems, methods, and/or computer program products. Accordingly, some or all of the subject matter may be embodied in hardware and/or in software (including firmware, resident software, micro-code, state machines, gate arrays, etc.) Furthermore, the subject matter may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. By way of example, and not limitation, computer readable media may comprise computer storage media and communication media.

Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can accessed by an instruction execution system. Note that the computer-usable or computer-readable medium could be paper or another suitable medium upon which the program is printed, as the program can be electronically captured, via, for instance, optical scanning of the paper or other medium, then compiled, interpreted, of otherwise processed in a suitable manner, if necessary, and then stored in a computer memory.

Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable media.

When the subject matter is embodied in the general context of computer-executable instructions, the embodiment may comprise program modules, executed by one or more systems, computers, or other devices. Generally, program modules include routines, programs, objects, components, data structures, etc. that perform particular tasks or implement particular abstract data types. Typically, the functionality of the program modules may be combined or distributed as desired in various embodiments.

FIG. 1 is a diagram of an embodiment 100 showing a system for generating a circuit representation of a function. Embodiment 100 illustrates the functional elements may be used to automatically generate an optimized decision tree based circuit that generates an output according to an input function. Embodiment 100 may be used to generate circuits for any type of function, and may produce more accurate and faster performing circuits than when alternative methods of function representation are used.

The diagram of FIG. 1 illustrates functional components of a system. In some cases, the component may be a hardware component, a software component, or a combination of hardware and software. Some of the components may be application level software, while other components may be operating system level components. In some cases, the connection of one component to another may be a close connection where two or more components are operating on a single hardware platform. In other cases, the connections may be made over network connections spanning long distances. Each embodiment may use different hardware, software, and interconnection architectures to achieve the functions described.

Embodiment 100 may be implemented as part of a circuit design system. Embodiment 100 may be used to generate the basic structure of a circuit, which may be defined using net lists and subsequently laid out, routed, and otherwise used to create a functioning circuit. The circuit may be used in an integrated circuit, a printed circuit board, or some other representation of a circuit.

By implementing a function using a circuit, a complex calculation may be reduced to a very high speed set of circuits with minimal computation. Such implementations are useful for various digital signal processing applications, especially in communications where a continuous communication stream may be analyzed. One such example may be performing decoding of LDPC codes or other error correcting codes where complex calculations may otherwise be used. The high speed of a hardware implemented circuit may have tremendous speed and complexity advantages over processors that would otherwise perform complex calculations to implement an error correcting code.

An input mechanism 102 may receive a function 104 that may be represented, a range 106 of input values, and a precision parameter 108.

The function 104 may be defined using any mechanism. For example, a function may be represented as an expression Y=f(X) using a script, a function, a piece of executable code, or some other mechanism so that computations may be made using the expression. In some cases, a function may be represented as a table of input and output values.

The range 106 of input values may be a defined upper and lower limit of acceptable input values. The precision parameter 108 may be a value or expression that may define how accurate the result may be. In some embodiments, the precision parameter 108 may define a number of significant digits.

Using the function 104, range 106, and precision parameter 108, the decision tree generator 110 may generate a decision tree 111. A solution generator 112 may populate the decision tree 111 with solutions, and an optimizer 114 may prune the tree.

The circuit generator 116 may further optimize the circuit using factoring or other methods, resulting in a circuit 118.

Figure 2:
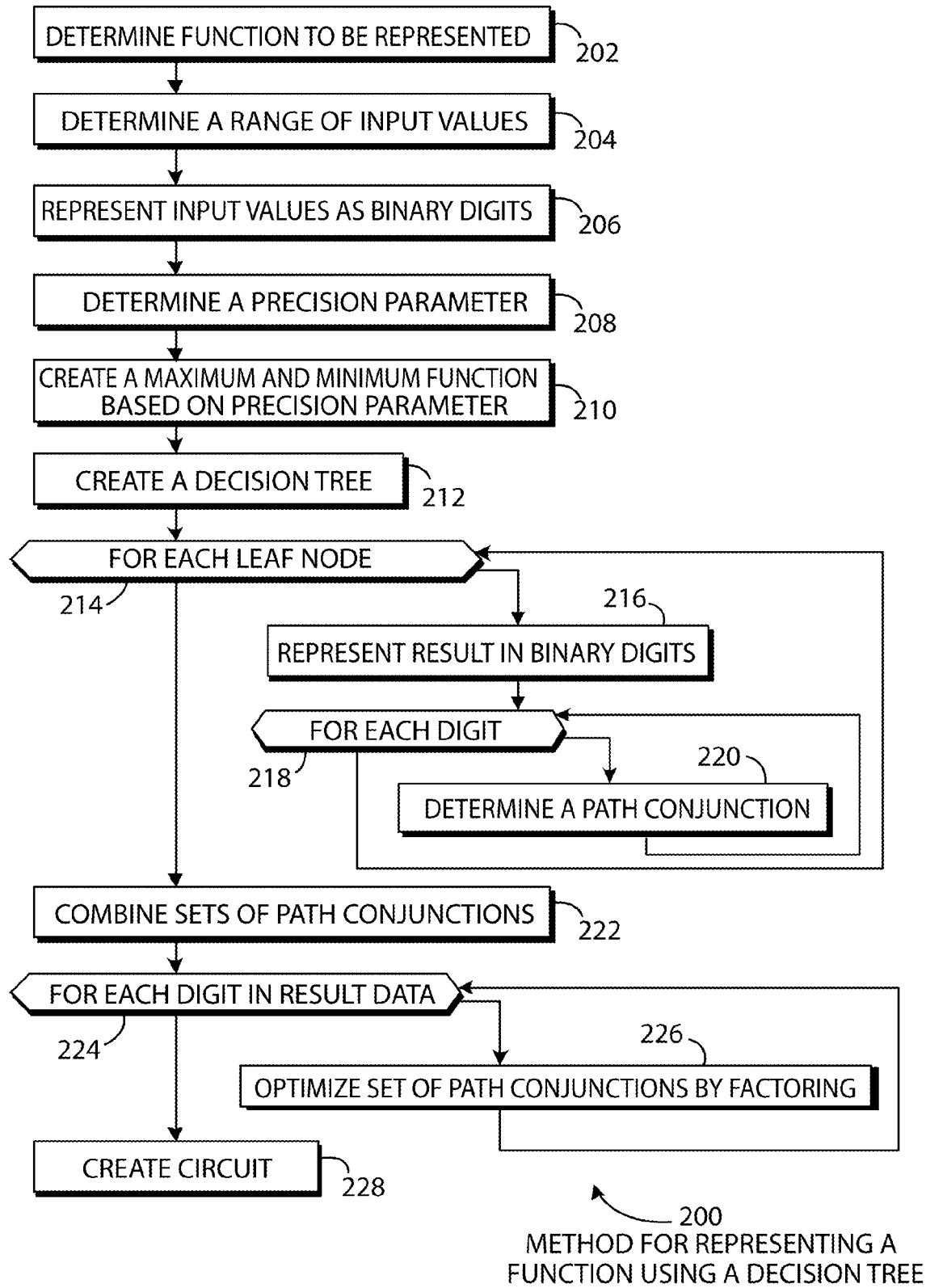
FIG. 2 is a flowchart illustration of an embodiment showing a method for representing a function using a decision tree.

FIG. 2 is a flowchart illustration of an embodiment 200 showing a method for representing a function using a decision tree. Embodiment 200 is an example of a sequence that may be used in an automated fashion to create a circuit that may be used to return an output value according to a predefined function. Embodiment 200 is an overall process, an example of which is illustrated later in this specification.

Other embodiments may use different sequencing, additional or fewer steps, and different nomenclature or terminology to accomplish similar functions. In some embodiments, various operations or set of operations may be performed in parallel with other operations, either in a synchronous or asynchronous manner. The steps selected here were chosen to illustrate some principles of operations in a simplified form.

The function to be represented may be determined in block 202. The function may be any type of function, and may be represented as Y=f(X), where Y is the output and X is the input.

In block 203, a fixed point representation of the values may be defined. For example, an input value may be represented by two values before a decimal place and three values trailing the decimal place. An example of such a representation may be found in the illustration of FIG. 4.

A range of input values may be determined in block 204, and the range may be represented in binary in block 206. A decision tree may be constructed to represent the binary digits of the potential input values, as will be described hereinafter.

A precision parameter may be defined in block 208. The precision parameter may be used to construct the decision tree. For a high precision result, that is, one with greater accuracy, the decision tree and subsequent circuitry may be more complex than for a low precision result.

Figure 3:
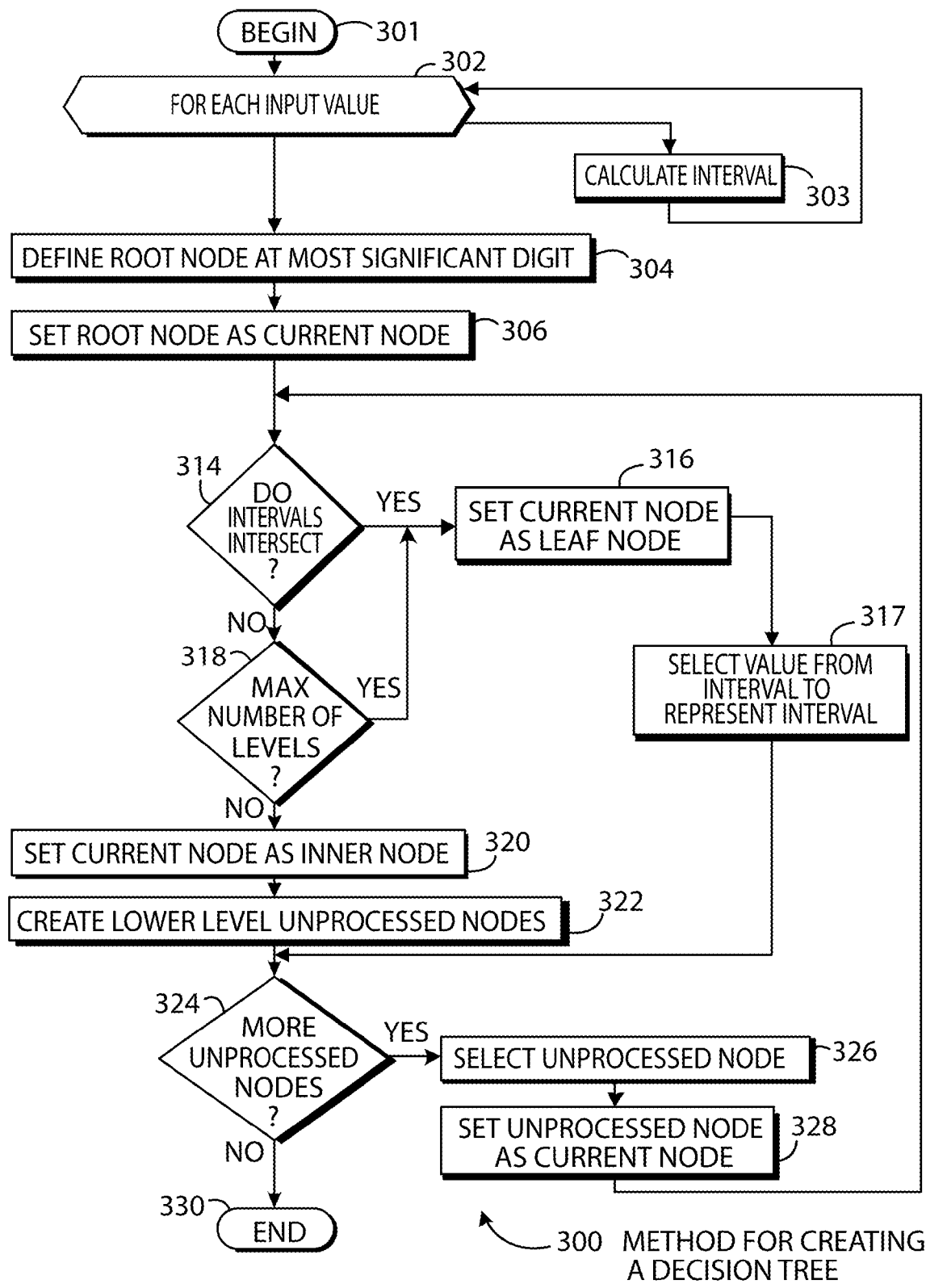
FIG. 3 is a flowchart illustration of an embodiment showing a method for creating a decision tree.

A maximum and minimum function may be defined in block 210 based on the precision parameter and the function to be determined. The maximum and minimum function may be used to create a decision tree in block 212. A detailed method for creating an optimized decision tree is illustrated in FIG. 3, later in this specification.

The decision tree may be constructed using a root node to represent the most significant bit of the input data. For each subsequent layer of the decision tree, the next significant bit may be represented. Since the binary bits are arranged in a hierarchy, each node in the decision tree may represent one input value when the node is at the lowest level of the decision tree, or may represent a range of input values if the node is not at the lowest level.

The decision tree may be constructed with leaf nodes and inner nodes. A leaf node may be any node for which all of the lower nodes have the same result. An inner node may be a node for which the results of lower nodes may be different.

For each leaf node in block 214, the result may be represented in binary digits in block 216. For each digit in the result in block 218, a path conjunction may be determined.

The function $Y_r=f(X_r)$ may be represented by real argument $X_r$ and the real value $Y_r$ by the fixed point numbers: $X=\{x_n, x_{n-1}, \ldots x_1\}$ and $Y=\{y_m, y_{m-1}, \ldots y_1\}$ where $x_i$, $i=1, \ldots n$ and $y_j$, $j=1, \ldots m$ are their individual bit variables ($x_n$ and $y_m$ are the most significant bits).

Then a decision tree for the function Y=f(X) is constructed as an ordered binary tree whose inner nodes are labeled as the X bits $\{x_n, x_{n-1}, \ldots x_1\}$ and the leaves represent all the possible Y values. An example of such a decision tree is provided in FIG. 4. The number of Y values can be limited by the precision parameter. This precision parameter allows the creation of the two functions, $f_{min}(X)$ and $f_{max}(X)$, such that the value Y for each X lies in the interval $[f_{min}(X), f_{max}(X)]$.

If there is an intersection between all the intervals $[f_{min}(X); f_{max}(X)]$, the whole tree is reduced to one node which is both the root and a leaf node at the same time. Otherwise, the tree may be created recursively, starting from the most significant bit $x_n$ of the input X by using the next procedure. The bit $x_n$, is made a root of the tree and the table of all the intervals $[f_{min}(X), f_{max}(X)]$ is split into two half-sized tables: the left one, for which $x_n=0$ and the right one, for $x_n=1$. This way the root gets the two child nodes, corresponding to the two tables. Each child node can be a leaf node or an inner node (if a node is an inner node its table will further be split into the two tables). The decision about the node type is made by separately processing the child node tables. It is first checked if all the intervals from a table intersect: if they do, the child node becomes a leaf node; if they do not, the child node becomes an inner node and is labeled by the next most significant bit variable, $x_{n-1}$.

In the case of a leaf node, its Y value may be chosen as the value that has the most trailing zeros in the intersection set. If a node is an inner node, it gets the two new child nodes, one for its '0' value and the other for its '1' value.

Let d be a node in the tree and let's introduce the node sets $L_{i,c}$ as:
$L_{i,c} = \{d \mid d$ is the root of a largest sub-tree in which the i-th bit at the leaves is always $c\}$,
where: i is an index of Y bit variables $y_i$, $i=1, \ldots m$ and c is either 0 or 1. Thus, if the function computation comes to a decision tree node d belonging to $L_{i,C}$, the i-th bit of Y will always be equal to C.

Let's also introduce the path conjunction for a node d as $p_d(X)$:

$$p_d(X) = \begin{cases} \text{true,} & \text{If the } f(X) \text{ computation passes through node } d \\ \text{false,} & \text{Otherwise} \end{cases}$$

If $x_i$ is a variable on the decision tree path from the root to d and d is in a sub-tree rooted at the left $x_i$ child, then $p_d(X)$ contains $\overline{x_i}$; if it is in a sub-tree rooted at the right $x_i$ child, $p_d(X)$ contains $x_i$. Looking at FIG. 1 it would mean, for example, if the node $x_{n-3}$ is on the computation path that $P_{x_{n-3}}(X) = x_{n-2} \hat{} \overline{x}_{n-1} \hat{} \overline{x}_n$.

The sets of path conjunctions may be combined in block 222. An expression for each output bit $y_i$, $i=1, \ldots m$ as:

$$y_i = \bigvee_{d \in L_{i,1}} p_d(X) \quad (1)$$

or, alternatively $$y_i = \overline{\bigvee_{d \in L_{i,0}} p_d(X)} \quad (2)$$

For each digit in the result expression in block 224, the set of path conjunctions may be optimized by factoring the expressions (1) or (2). The identity $a\hat{}b \vee a\hat{}c = a\hat{}(b \vee c)$ may be used to determine sections of the conjunctions that may be common and thus may be used to optimize the resulting circuit. The $p_d(X)$ in $L_{i,0}$ or $L_{i,1}$ may be split according to the relation above. Then each common $p_s(X)$ may be factored out whenever possible.

An arbitrary expression E of the form $E = \vee e_i$ can be calculated in the depth p, given by the next equation:

$$p = \left\lceil \log_2 \sum_i 2^{p_i} \right\rceil \quad (3)$$

The relation (3) is valid under a condition that the sub-expressions $e_i$ are grouped in a particular way. In (3), $p_i$ is a depth of a sub-expression $e_i$ and i goes from 1 to the total number of sub-expressions in E. The expression (1) (or (2) with the negation) remains in the form E. In order to achieve the depth p the next procedure is applied to it.

All the 'constituent' depths $p_i$ are sorted in descending order and a new disjunction is made out of the two sub-expressions $e_i$ with the two smallest $p_i$. This disjunction is now a new sub-expression whose depth is greater by one from the deeper of the two sub-expressions it was made of. These two sub-expressions are then removed from E and replaced by the newly created sub-expression. All the depths are sorted again and the two sub-expressions with the smallest depths are grouped again with a new disjunction. The process is repeated until all the sub-expressions are processed.

Once the optimized set of paths are determined, the circuit may be created using those paths in block 228.

FIG. 3 is a flowchart illustration of an embodiment 300 showing a method for creating a decision tree. Embodiment 300 is an example of a sequence that may be used in an automated fashion to create an optimized decision tree. The decision tree may be created using a recursive method to traverse the tree and build the various leaves.

Other embodiments may use different sequencing, additional or fewer steps, and different nomenclature or terminology to accomplish similar functions. In some embodiments, various operations or set of operations may be performed in parallel with other operations, either in a synchronous or asynchronous manner. The steps selected here were chosen to illustrate some principles of operations in a simplified form.

The process for creating a decision tree may begin in block 301.

For each input value in block 302, the interval may be calculated in block 303. The interval may be calculated using a maximum and minimum function. For example, a set of functions $f_{max} = f(X + \text{tolerance})$ and $f_{min} = f(X - \text{tolerance})$ may be defined where tolerance is the amount of input variation for the value of X. The tolerance may be the precision parameter 108.

A root node may be defined representing the most significant digit in block 304, and the root node may be set as the current node in block 306.

If the intervals for the current node intersect in block 314, the current node may be defined as a leaf node in block 316.

In block 317, a result value may be selected to represent the values of the interval, since an interval may have a range of values. In some embodiments, a value with the most trailing zeros in a binary representation of the value may be selected. Other embodiments may use other criteria, such as the maximum number of 1 digits or 0 digits, or the largest or smallest value. The selection of a representative value may affect the complexity or configuration of the resulting circuitry.

If the intervals are not intersecting in block 314, and the maximum number of levels is reached in block 318, the current node is set as a leaf node in block 316 and the process may continue with block 324.

The maximum number of levels in the decision tree corresponds to the number of significant digits of the input.

If the maximum number of levels is not reached in block 318, the current node may be defined as an inner node in block 322 and two lower level nodes may be created as unprocessed nodes in block 324.

When two lower level nodes are created in block 324, the set of intervals may be split into a set having the parent node bit equal to zero and another set having the parent node bit equal to one. In some embodiments, the two sets may be equal.

If an unprocessed node exists in block 324, an unprocessed node may be selected in block 326 and set as current node in block 328. The process may continue with block 308.

If no unprocessed nodes exist in block 324, the process may end in block 330.

The embodiment 300 may produce a pruned decision tree in some instances. Other embodiments may create a full decision tree, generate results for each node of the full decision tree, and prune portions of the decision tree that contain the same results or results within a predefined tolerance band or precision parameter.

Figure 4:
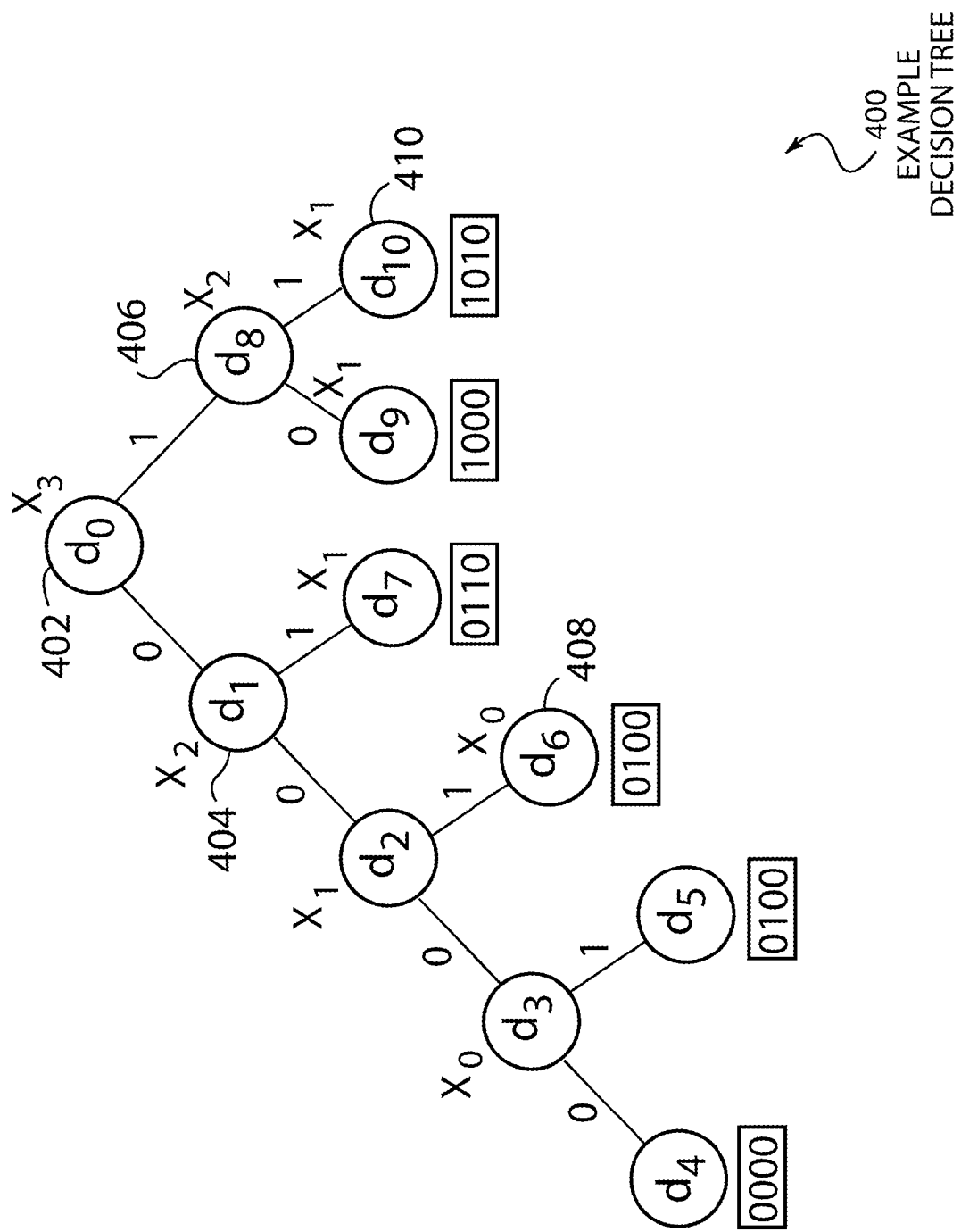
FIG. 4 is a diagram illustration of an embodiment showing an example of a decision tree.

FIG. 4 is a diagram illustration of an embodiment 400 of an example decision tree. Embodiment 400 is an example chosen to illustrate some of the concepts and procedures described in this specification.

Embodiment 400 is an example of a decision tree for a function $$Y=2\sqrt{X}$$

for the range of X=0, 1.875. X may be expressed in binary as $X=\{x_3,x_2,x_1,x_0\}$ and $Y=\{y_3,y_2,y_1,y_0\}$. The node 402 may represent $x_3$, and nodes 404 and 406 may represent $x_2$ and so on. Node 404 represents all input values when $x_3$ is 0, and node 406 represents all input values when $x_3$ is 1.

Table 1 illustrates the input and output results of the function.

TABLE 1

| X (dec) | Y (dec) |
|---|---|
| 0.0000 | 0.0000 |
| 0.1250 | 0.7071 |
| 0.2500 | 1.0000 |
| 0.3750 | 1.2247 |
| 0.5000 | 1.4142 |
| 0.6250 | 1.5811 |
| 0.7500 | 1.7321 |
| 0.8750 | 1.8708 |
| 1.0000 | 2.0000 |
| 1.1250 | 2.1213 |
| 1.2500 | 2.2361 |
| 1.3750 | 2.3452 |
| 1.5000 | 2.4495 |
| 1.6250 | 2.5495 |
| 1.7500 | 2.6458 |
| 1.8750 | 2.7386 |

In the first column, the input X is shown in real numbers, and the result Y is shown in real numbers in the second column. Table 2 illustrates the floating point representation of the input values X in decimal and binary. X is represented with one bit for the integer part and 3 bits for the fraction part in fixed point.

TABLE 2

| X (fp) as dec | X (fp) |
|---|---|
| 0 | 0000 |
| 1 | 0001 |
| 2 | 0010 |
| 3 | 0011 |
| 4 | 0100 |
| 5 | 0101 |
| 6 | 0110 |
| 7 | 0111 |
| 8 | 1000 |
| 9 | 1001 |
| 10 | 1010 |
| 11 | 1011 |
| 12 | 1100 |
| 13 | 1101 |
| 14 | 1110 |
| 15 | 1111 |

For the result, the interval [Ymin, Ymax]=[$f_{min}$(X), $f_{max}$(X)] is calculated from two functions, $f_{min}$(X), and $f_{max}$(X), which may be defined as $Y_{max}$=f(X+0.25) and $Y_{min}$=f(X−0.25). Table 3 represents the results of Y in the fixed point domain in decimal and binary. The floating point representation of Y is uses two bits for the integer part and 2 bits for the fraction part.

TABLE 3

| Y (fp) | Ymin | Ymax | Ymin | Ymax |
|---|---|---|---|---|
| 0 | 0 | 1 | 0000 | 0001 |
| 3 | 2 | 4 | 0010 | 0100 |
| 4 | 3 | 5 | 0011 | 0101 |
| 5 | 4 | 6 | 0100 | 0110 |
| 6 | 5 | 7 | 0101 | 0111 |
| 6 | 5 | 7 | 0101 | 0111 |
| 7 | 6 | 8 | 0110 | 1000 |
| 7 | 6 | 8 | 0110 | 1000 |
| 8 | 7 | 9 | 0111 | 1001 |
| 8 | 7 | 9 | 0111 | 1001 |
| 9 | 8 | 10 | 1000 | 1010 |
| 9 | 8 | 10 | 1000 | 1010 |
| 10 | 9 | 11 | 1001 | 1011 |
| 10 | 9 | 11 | 1001 | 1011 |
| 11 | 10 | 12 | 1010 | 1100 |
| 11 | 10 | 12 | 1010 | 1100 |

The tree of embodiment 400 may be constructed by the method described in embodiment 300 of FIG. 3. At each intersection of intervals, the value with the most trailing zeros is selected. By selecting the most trailing zeros in the binary representation of the interval, the resulting tree and circuits may be efficiently pruned. Other embodiments may use different criteria for selecting a representative value for a leaf node and may result in different circuit configurations.

Node 408 represents an input value of X=$\{001x_0\}$, and where the result Y=$\{0100\}$ is true for all lower nodes. Similarly, node 410 represents the input value X=$\{11x_1x0\}$ and a result Y=$\{1010\}$.

The embodiment 400 illustrates a pruned or optimized decision tree. Nodes with common results, such as the nodes underneath node 408, may be replaced with a leaf node 408.

Each used node is notated as $d_x$ for the next operation. For example, node 402 may be notated as $d_0$, as node 404 may be notated as $d_1$ and node 408 as $d_9$.

The conjunctions $L_{i,c}$ may be calculated as follows.

$$L_{0,1}=\{0\}$$

$$L_{1,1}=\{d_7,d_{10}\}$$

$L_{2,1} = \{d_5, d_6, d_7\}$ $L_{3,1} = \{d_8\}$ and so forth.

Using $L_{0,1}$, $$y_0 = 0 \quad (4)$$

For $L_{1,1}$ $$y_1 = x_2\overline{x_3} \quad (5)$$

where $\overline{x_x}$ is the branch representing the 0 bit. Similarly, for $L_{2,1}$ $$y_x = x_0\overline{x_1}\overline{x_2}\overline{x_3} + x_1\overline{x_2}\overline{x_3} + x_2\overline{x_3} \quad (6)$$

and for L3,1, $$y_3 = x_3 \quad (7)$$

Equation (6) may be factored as:

$$y_2 = \overline{x_3}[x_2 + \overline{x_2}(x_0\overline{x_1} + x_1)] \quad (7)$$

and so forth.

Figure 5:
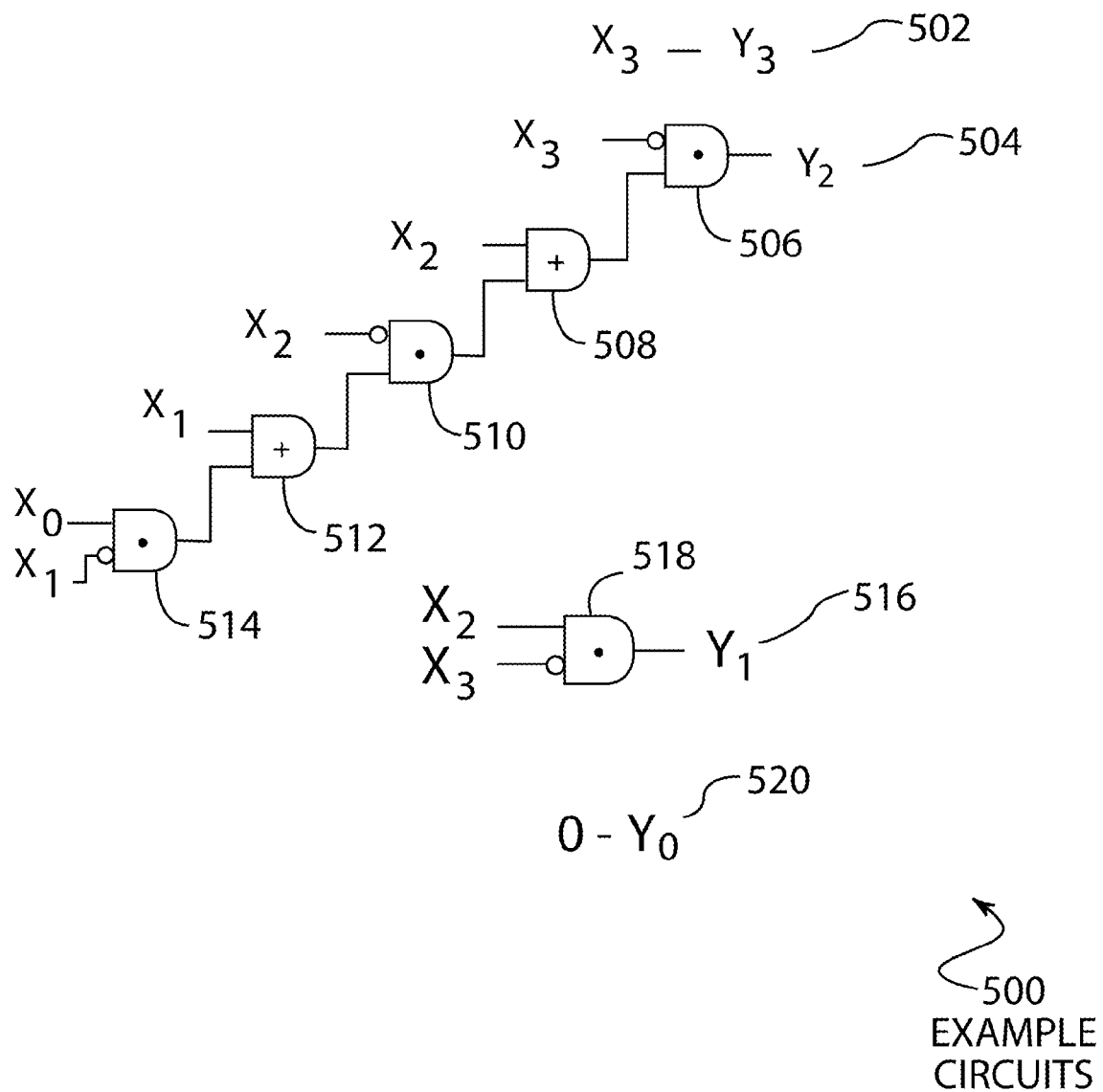
FIG. 5 is a diagram illustration of an embodiment showing a set of circuits that may be created using the decision tree of the embodiment shown in FIG. 4.

FIG. 5 is a diagram illustration of an embodiment 500 showing a set of circuits that may be created using the decision tree of embodiment 400.

Circuit 502 merely has the input bit x3 being connected to the output bit y3.

Circuit 504 uses all the input bits combined using AND or OR gates to determine the y2 bit. x0 and negative x1 are combined using an AND gate 514. The output is combined with x1 using OR gate 512, and that output is combined with negative x2 using AND gate 510. The output of AND gate 510 is combined with x2 using OR gate 508, and that output is combined with negative x3 using AND gate 506 to yield y2.

Circuit 516 combines x2 and negative x3 using AND gate 518 to produce

Circuit 520 sets the value of y0 as 0 for all values of x.

The circuits of embodiment 500 are examples of how a decision tree may be used to represent an arbitrary circuit.

The foregoing description of the subject matter has been presented for purposes of illustration and description. It is not intended to be exhaustive or to limit the subject matter to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments except insofar as limited by the prior art.

What is claimed is:

1. A method comprising:
   determining a function to be represented;
   determining a range of input values, said input values being defined by a set of binary numbers having a first number of digits;
   defining an output precision parameter;
   creating a first decision tree having a root node corresponding to the most significant bit of said input values and having a number of levels corresponding to said first number of digits, said first decision tree having at least one leaf node comprising a result corresponding to said output precision parameter;
   for each of said leaf nodes, representing said result using a set of binary digits;
   for each digit in said result, determining a set of path conjunctions that define a common value for said digit;
   defining a circuit comprising said set of path conjunctions;
   wherein the method is performed at least in part by a computer.

2. The method of claim 1 further comprising:
   optimizing said set of path conjunctions by defining a function for each of said path conjunctions and factoring said set of path conjunctions.

3. The method of claim 2 further comprising:
   pruning said first decision tree by removing at least a portion of said first decision tree where two or more lower level nodes comprise identical results.

4. The method of claim 3, said function comprising a Gallager function.

5. The method of claim 4, said circuit being an integrated circuit.

6. An integrated circuit being designed at least in part by the method of claim 1.

7. A circuit generation system comprising:
   an input mechanism configured to receive:
      a function to be represented;
      a range of input values being defined by a set of binary numbers having a first number of digits; and
      an output precision parameter;
   a decision tree generator configured to generate a decision tree having a root node corresponding to a most significant digit of said first number of digits and a plurality of levels corresponding to said first number of digits;
   a solution generator configured to generate a solution for said function using an input defined by a leaf node on said decision tree; and
   a circuit generator configured to generate a set of path conjunctions for each of a set of binary digits representing said solution at each of said leaf nodes, and define a circuit comprising at least a portion of said path conjunctions.

8. The circuit generation system of claim 7, said circuit generator being further configured to optimize said set of path conjunctions by defining a function for each of said path conjunctions and factoring said set of path conjunctions.

9. The circuit generation system of claim 7, said decision tree generator further configured to prune said decision tree by removing at least a portion of said decision tree where two or more lower level nodes comprise identical results.

10. The circuit generation system of claim 7 further comprising:
    a net list generator configured to generate a net list based on said circuit; and
    a routing tool configured to generate a circuit routing for said circuit.

11. The circuit generation system of claim 10, said circuit being implemented as an integrated circuit.

12. The circuit generation system of claim 7, said decision tree generator, said solution generator, and said circuit generator being fully automated.

13. A method comprising:
    determining a function to be represented;
    determining a range of input values for said function;
    representing said range of input values as a set of binary digits, said set having a number of digits and a most significant digit;
    determining a precision parameter for said function;
    creating a maximum function and a minimum function based on said function and said precision parameter;

creating a decision tree by a recursive method comprising:
  defining a root node presenting said most significant digit;
  setting said root node as a current node;
  calculating a maximum result using said maximum function;
  expressing said maximum result using a first number of binary digits;
  calculating a minimum result using said minimum function;
  expressing said minimum result using said first number of binary digits;
  if said maximum result and said minimum result are identical, establishing said current node as a leaf node;
  if said maximum result and said minimum result are not identical, establishing said current node as an inner node and creating two lower level nodes, said lower level nodes being unprocessed; and
  determining if another node is an unprocessed node and setting said another node as said current node; and creating a circuit representation of said decision tree by a method comprising:
  for each of said leaf nodes in said decision tree, representing said result using a set of binary digits;
  for each digit in said result, determining a set of path conjunctions that define a common value for said digit; and
  defining a circuit comprising said set of path conjunctions;

wherein the method is performed at least in part by a computer.

14. The method of claim 13 further comprising:
optimizing said set of path conjunctions by defining a function for each of said path conjunctions and factoring said set of path conjunctions.

15. A non-transitory computer readable storage medium comprising computer executable instructions configured to perform the method of claim 13.

* * * * *

UNITED STATES PATENT AND TRADEMARK OFFICE
CERTIFICATE OF CORRECTION

| | | |
|---|---|---|
| PATENT NO. | : 7,877,724 B2 | |
| APPLICATION NO. | : 12/117851 | |
| DATED | : January 25, 2011 | |
| INVENTOR(S) | : Andreev et al. | |

It is certified that error appears in the above-identified patent and that said Letters Patent is hereby corrected as shown below:

On the cover page, Item (75) Inventors, second inventor name, replace "Vokovic" with --Vukovic--.

On the cover page, Item (75) Inventors, third inventor residence, replace "Saratogo" with --Saratoga--.

Signed and Sealed this
Twenty-ninth Day of March, 2011

David J. Kappos
*Director of the United States Patent and Trademark Office*